(12) United States Patent
Ziermann

(10) Patent No.: US 6,535,027 B1
(45) Date of Patent: Mar. 18, 2003

(54) LOW POWER PEAK DETECTOR

(75) Inventor: Mark S. Ziermann, Bolingbrook, IL (US)

(73) Assignee: Westell, Inc., Aurora, IL (US)

( * ) Notice: Subject to any disclaimer, the term of this patent is extended or adjusted under 35 U.S.C. 154(b) by 0 days.

(21) Appl. No.: 09/565,362

(22) Filed: May 5, 2000

(51) Int. Cl.[7] .............................................. G01R 19/00
(52) U.S. Cl. .............................. 327/59; 327/73; 327/95
(58) Field of Search .............................. 327/50, 51, 52, 327/54, 56, 58, 59, 60, 62, 63, 64, 73, 87, 89, 90, 91, 94, 95, 77

(56) References Cited

U.S. PATENT DOCUMENTS

| | | | | |
|---|---|---|---|---|
| 3,628,059 A | * | 12/1971 | Niu | 327/72 |
| 4,038,568 A | * | 7/1977 | May et al. | 327/60 |
| 4,352,030 A | * | 9/1982 | Beesley | 327/58 |
| 4,937,670 A | * | 6/1990 | Whiteledge | 348/678 |
| 4,988,895 A | * | 1/1991 | Kihara et al. | 327/73 |
| 4,992,674 A | * | 2/1991 | Smith | 327/59 |
| 4,996,448 A | * | 2/1991 | Abdi | 327/59 |
| 5,025,176 A | * | 6/1991 | Takeno | 327/58 |
| 5,038,055 A | * | 8/1991 | Kinoshita | 327/58 |
| 5,315,168 A | * | 5/1994 | Norton, Jr. | 327/58 |
| 5,362,992 A | * | 11/1994 | Wile | 327/58 |
| 5,510,734 A | * | 4/1996 | Sone | 324/65 |
| 5,546,027 A | * | 8/1996 | Shinozaki et al. | 327/59 |
| 6,051,998 A | * | 4/2000 | Lee et al. | 327/59 |
| 6,191,621 B1 | * | 2/2001 | Ota | 327/58 |
| 6,201,419 B1 | * | 3/2001 | Kamei | 327/77 |

* cited by examiner

Primary Examiner—Timothy P. Callahan
Assistant Examiner—Hai L. Nguyen
(74) Attorney, Agent, or Firm—McDonnell Boehnen Hulbert & Berghoff

(57) ABSTRACT

A peak detector circuit providing a comparator that produces a low voltage output by pulling the output to common when an input signal exceeds a reference voltage and that produces a floating output by not conducting when the input signal does not exceed the reference voltage. A low output from the comparator generates a base current sufficient to drive a PNP transistor, which in turn drives current to a DC output capacitor. Until the input signal exceeds the reference voltage, neither the comparator nor the PNP transistor need to conduct and, consequently, the peak detector consumes relatively little power. The peak detector can be beneficially employed in a network interface unit or other transmission line unit.

3 Claims, 4 Drawing Sheets

LOW POWER PEAK DETECTOR

BACKGROUND OF THE INVENTION

1. Field of the Invention

The present invention relates generally telecommunications transmissions systems and more particularly to a peak detector for T1 span equipment.

2. Description of Related Art

Many telecommunication transmission systems include a central office (CO) that may transmit useful data, or "payload," signals over transmission lines to equipment on customer premises. Typically, digital payload signals are sent over the transmission lines through an office repeater a series of regenerative repeaters, to a network interface unit (NIU), and in turn to customer premises equipment (CPE). Similarly, payload is carried from the CPE to the NIU and in turn to the CO.

The NIU typically sits at the point of demarcation between the telephone operating company's side of the telephone line and the customer's side of the telephone line. In general, the NIU is electrically transparent to payload signals. However, the NIU can be used for special maintenance functions such as loopback and performance monitoring.

The Bell telephone system in the United States, for instance, has widely utilized a digital time-domain multiplexing pulse code modulation system known as the T1 transmission system. Each T1 transmission system carries 24 8-KB/second voice or data channels on two pairs of exchange grade cables. One pair of cables provides communication in each direction. T1 transmission systems are used in multiples "N", thus providing N×24 channels on N×2 cable pairs.

Figure 1:
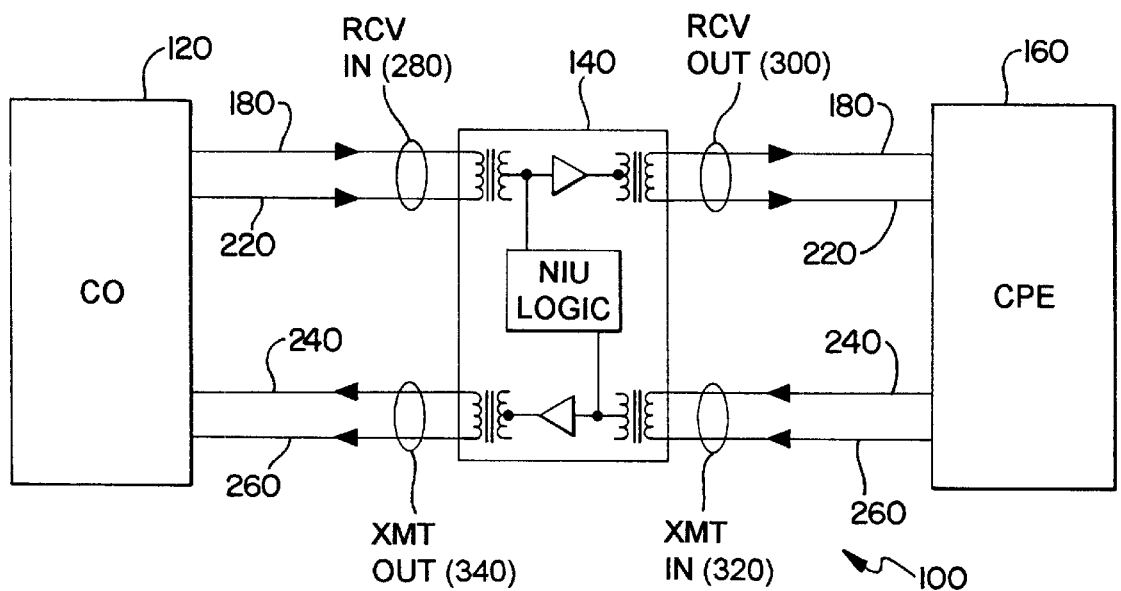

FIG. 1 illustrates in general the arrangement of a telecommunications transmission system 100 including an NIU. As shown in FIG. 1, system 100 includes a central office 120, an NIU 140 and a CPE 160. A first pair of tip and ring cables 180, 220 carries signals from the central office to the customer premises and is referred to as the receive or "RCV" line. A second pair of tip and ring cables 240, 260 carries signals from the customer premises to the central office and is referred to as the transmit or "XMT" line.

Thus, in regular operation, an NIU may receive signals from the network via a "RCV IN" line 280 and may then pass those signals via a "RCV OUT" line to the CPE 300. Similarly, the NIU may receive signals from the CPE via an "XMT IN" line 320 and may then pass those signals via an "XMT OUT" 340 line to the central office. Of course, these designations are made only for convenience and may change depending on the perspective of an observer.

In the T1 system, the data to be transmitted over the lines, such as speech, is sampled at a rate of 8,000 hertz, and the amplitude of each sample is measured. The amplitude of each sample is compared to a scale of discrete values and assigned a numeric value. Each discrete value is then encoded into binary form. Representative binary pulses appear on the transmission lines. The binary form of each sample pulse consists of a combination of seven pulses, or bits. An eighth bit is periodically added to allow for signaling.

A coding system is typically used to convert the analog signal to a digital signal. The system guarantees some desired properties of the signal, regardless of the pattern to be transmitted. The most prevalent code in the United States is bipolar coding with an all zero limitation (also called Alternative Mark Inversion or "AMI"). With bipolar coding, alternating ones (high bits) are transmitted as alternating positive and negative pulses, so as to assure a direct current balance and avoid base line wander. Further, an average density of one pulse in eight slots, with a maximum of fifteen zeros between "ones," is required. This is readily obtained in voice-band coding, however, by simply not utilizing an all zero word. Contrasted with bipolar coding is unipolar coding, in which every occurrence of a high bit is seen as a positive pulse.

In many telecommunication systems, data may be transmitted sequentially in discrete groups of bits called "frames." In the T1 system, for instance, each of the 24 channels in the T1 system is sampled within a 125 microsecond period (equivalent to $\frac{1}{8000}$) of a second, constituting one frame. A synchronizing bit, or "frame bit," is added to each frame to serve as a flag, enabling line elements to distinguish each frame from the preceding frame or from noise on the line. Since there are 8 bits per channel and there are 24 channels and one frame bit at the end of each frame, the total number of "bits" needed per frame is 193. Thus, the resulting line bit rate for T1 systems is 1.544 million bits per second.

Signals that violate either the coding rules or the framing rules established in a particular system are detected as errors. Thus, for example, under a bipolar coding scheme, two positive pulses should never occur in sequence. To the extent such pulses do occur adjacent to each other, such a signal may be noted as a bipolar coding violation. Similarly, a digital signal that violates framing rules (such as framing bit requirements) established in a given system is detected as a "frame error." In a given encoding protocol, a sufficient number of frame errors may be detected as a frame loss.

In telecommunications transmission systems, it is occasionally necessary to monitor the performance characteristics of a particular transmission line. By monitoring transmission line performance, service providers can proactively respond to facility performance degradation and can therefore improve the telecommunications circuit.

Being positioned at the point of demarcation between the network and CPE, an NIU can be conveniently configured to assist with performance monitoring in several ways. For example, an NIU can be arranged to provide a "maintenance loopback" function, in which the NIU shunts back incoming signals to the direction from which they came. Loopback can be used to test the continuity and performance of the transmission system up to and including the NIU, either from the network (CO) side or the customer (CPE) side, by allowing a remotely positioned test set to determine whether a signal sent to the NIU returns unaltered.

To establish loopback on the network side, for instance, the central office may send a "loopup" command to an NIU, instructing the NIU to enter loopback. In that event, the NIU would internally switch the signals that it receives from the network (on the RCV IN line) onto the line that transmits to the network (the XMT OUT line), so as to shunt signals from the central office back to the central office. In this state, if the same test signal that is sent down the transmission line from the central office to the NIU for a substantial period of time is received back by central office, then the central office can be substantially assured that the two way transmission system between the central office and the NIU is functioning properly. Alternatively, if the same signal applied to the transmit line does not return along the receive line, then the central office can determine that an error or malfunction has occurred at a point along that T1 line.

When an NIU enters network loopback, the transmission of signals along the receive line from the central office to the CPE is interrupted. Consequently, during that period, an NIU will typically generate and apply to the RCV OUT line an alarm indication signal (AIS) (e.g., a continuous sequence of all 1's), indicating a loss of the network signal.

In addition to performing loopback, an NIU can serve other performance monitoring functions as well. For example, an NIU can monitor the signals being transmitted between the central office and CPE in order to identify the presence of transmission errors such as bipolar violations or out of frame conditions. The NIU may maintain a record of these errors for later reporting to a service technician or test system.

As another example, an NIU may be arranged to monitor the signals being transmitted along the transmission line in order to identify and respond to predefined control codes. These control codes may represent requests for information or may comprise instructions to take various actions. In response to such codes, the NIU may return transmission performance statistics, report its operating state, change its operating state or take other action.

As still another example, an NIU may be arranged to monitor the signals being transmitted along the transmission line in order to determine when a loss of signal (LOS) occurs on either the network or CPE side. Typically, in response to a LOS on one side, an NIU will generate and apply an AIS to its outgoing line on the other side, so as to alert the other side that a LOS exists. For instance, if an NIU stops receiving signals on its XMT IN line, the NIU may automatically transmit an AIS via its XMT OUT line, to notify the central office that signal transmission from the CPE has stopped.

In addition, an NIU can be arranged to regenerate and build out the signals that it receives before forwarding the signals on to another location. For this purpose, an NIU typically includes a regenerator and a line build out (LBO) circuit. The regenerator may operate to amplify an input signal to account for attenuation along the transmission line and to substantially recreate the original signal. The LBO, in turn, may simulate the attenuation and wave shaping that a signal would normally endure as it passes through cable, to reduce cross talk among bundled lines. Thus, for instance, when the NIU receives a signal from the central office, the NIU may regenerate the T1 signal and then apply it to the LBO circuit (which simulates the attenuation and wave shaping of the T1 signal as it passes through cable) before transmitting the signal to the CPE.

In operation, an NIU should be able to measure the peak level of an incoming AC signal, so as to be able to reconstruct an output wave representing the signal, or add a fixed amount of LBO loss relative to the input signal level, and thereby simulate a passive LBO function.

A peak detector typically comprises a comparator having as inputs an AC signal and a DC reference. The comparator output is established based on a measure of the difference between these two input signals. For instance, in one arrangement, whenever the AC signal is more positive than the DC reference, the comparator may provide a positive output, and whenever the AC signal is less than or equal to the DC reference, the comparator may provide no output. Various other arrangements are possible as well.

The peak detector circuit produces a DC output substantially representative of the peak of the incoming AC signal. To do so, the output of the comparator is typically used to charge an output capacitor to a representative DC output level, and the DC output is in turn used as a basis to establish the DC reference input to the comparator. Thus, as the AC signal level varies in relation to the DC reference, the comparator output varies and may therefore change the level of both the DC output and the DC reference input. By designing the capacitor circuit with appropriate charging and discharging time constants, the peak detector can be made more or less sensitive to variations in the AC input.

Limitations exist, however, in using the output of a comparator, alone, to charge the output capacitor. For instance, the output transistor stage of a typical comparator will act as a current sink rather than a current source. Consequently, the comparator output would only charge an output capacitor negatively and provide a negative DC output voltage relative to the negative peaks of the input waveform. Where the output of the peak detector is to be provided in turn to an analog-to-digital converter or other device that expects a positive input, such negative peak detector output is undesirable.

Instead of using only the comparator output to charge the capacitor, some existing peak detectors are arranged to charge the output capacitor via either an NPN transistor or a JFET controlled by the output of the comparator. In these arrangements, the comparator output turns the transistor on and off and thereby selectively turns on or off a current supply to the capacitor. In operation, the charging transistor is typically off most of the time, once the peak level has been established. Only when the detected signal exceeds the feedback reference will the transistor conduct, thereby causing the capacitor to charge to a higher DC voltage. The NPN transistor is kept in the non-conducting state by the application of a negative voltage on the base terminal relative to the transistor emitter. This is in turn accomplished by the comparator being turned on and having a low voltage output. The low output causes a current to flow through biasing resistors, and the corresponding voltage drop across the biasing resistors provides the negative base voltage to keep the charging transistor in an off state.

Thus, in a peak detector that uses an NPN transistor as the charging element, the peak detector uses considerable current and power due to the constant current used to establish the biasing voltage of the charging transistor. Furthermore, the NPN transistor depends on a resistor pull-up to provide current to the transistor base. Unfortunately, however, this arrangement is slow to turn on and provides little base current and consequently little current drive to charge the output capacitor. That is, after the comparator turns off, the NPN transistor turns on only after the base voltage has been pulled high by the supply voltage through the biasing pull up resistor. To increase the turn on speed, the biasing resistor should be low valued. However, the low resistive value means an even higher biasing current flow when it is desired to keep the transistor in the off state. Typically, the design trade off is selected to achieve power efficiency over speed. Therefore, this arrangement is not very responsive to high speed signal inputs.

Figure 2:
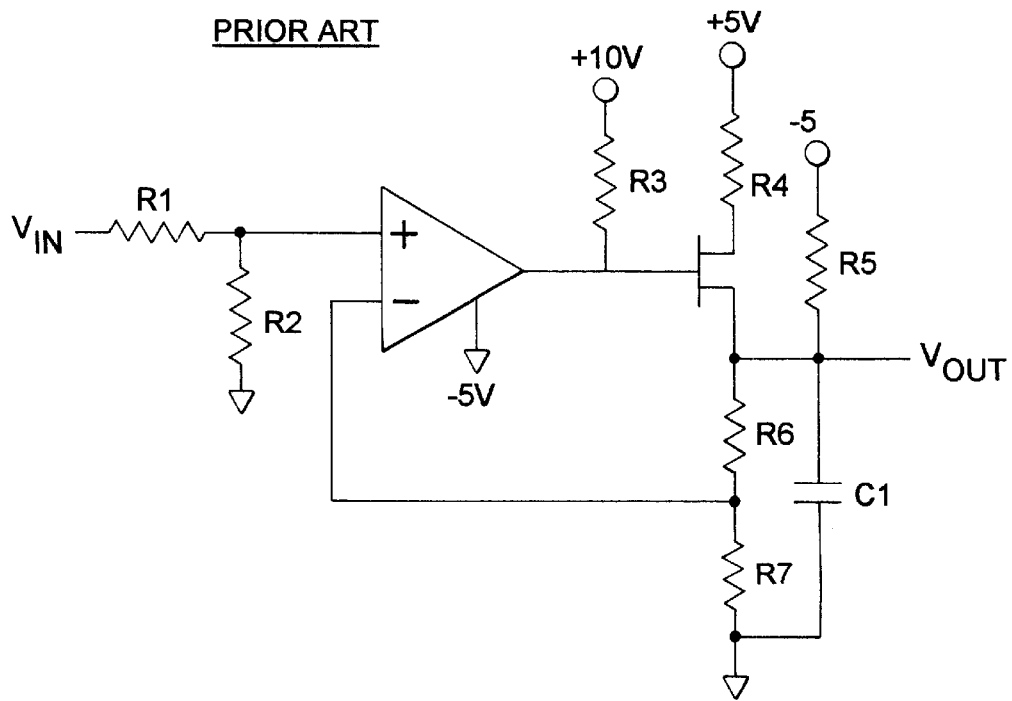

Alternatively, the peak detector may use an n-channel JFET as the charging element. FIG. 2 illustrates a prior art peak detector using a JFET as the charging element. As shown in FIG. 2, a comparator is tied to a negative voltage, and the output of the comparator feeds the gate of an n-channel JFET, which in turn feeds a DC output capacitor. Like the NPN transistor, the JFET is kept in the off condition (for the majority of the time) by the application of a negative voltage. Thus the comparator is conducting most of the time to draw a bias current through a pull-up resistor R3, resulting in a negative voltage being applied to the gate. In addition, the JFET gate capacitance varies considerably, and the pinch-off voltage threshold of the JFET also vary considerably, which leads to variations in response time of the peak detector to higher frequency input waveforms.

The JFET configuration has at least three disadvantages: (i) it requires a large voltage swing (from −5V to +10V) to turn on and begin charging the capacitor, (ii) the circuit as a whole has parasitic capacitive effects that impede this voltage change and hence cause an even slower response, and (iii) the on and off thresholds of the JFET are not consistent from part to part. While the JFET does not require base current, it does require a pull-up resistor R3 to bring the base voltage high, and current will flow through resistor R3 as long as the JFET is held off (which is most of the time). The voltage change from −5V to +10V is a significant voltage variation to achieve in a high-speed circuit.

The circuit capacitive effects compound the problem. Specifically, the JFET gate capacitance must be discharged. In addition, because the comparator output is typically the collector of a transistor within the comparator, the capacitance of this transistor must also be discharged. That is, when the comparator is outputting a low voltage to keep the JFET off, the transistor in the comparator is on and the output of −5V appears on the transistor collector. To then transition the JFET to the conductive state, the collector has to move from −5V to +10 V. Therefore, to turn on the JFET quickly, resistor R3 must be relatively small and therefore drawing more current when the JFET is off (which is most of the time).

SUMMARY

The present invention is directed to a low power peak detector circuit. An exemplary embodiment of the invention provides a comparator (i) that produces a low voltage output by pulling the output to common when an input signal exceeds a reference voltage and (ii) that produces a floating output by not conducting when the input signal does not exceed the reference voltage.

When the comparator produces a low voltage output, the difference between a power supply and the low voltage output drives current to the base of a PNP transistor, which causes the transistor to conduct and to thereby drive current to charge an output capacitor. The voltage across the output capacitor is applied to a voltage divider circuit, which produces the reference voltage for the comparator.

When the comparator produces a floating output, the difference between the power supply and the floating output does not drive sufficient base current to the PNP transistor. Consequently, in this state, the PNP transistor does not conduct and therefore does not drive current to charge the output capacitor. As a result, the output capacitor begins to slowly discharge (preferably at a relatively high time constant).

Most of the time, the output capacitor in this arrangement will therefore be charged to a level that is indicative of the maximum voltage of the input signal, scaled to a suitable output level (as a result of the voltage divider providing the reference voltage to the comparator). Only when the input exceeds the reference voltage (i.e., if the input rises sufficiently and/or if the output capacitor discharges sufficiently) will comparator conduct to common and drive the PNP transistor to charge the output capacitor.

Advantageously, the arrangement of the exemplary embodiment thus consumes relatively little power, since, most of the time, neither the comparator nor the PNP transistor need to conduct. Both elements need to conduct only when the output capacitor needs to be charged in response to a sufficient increase in the input signal level (or as the capacitor discharges).

Thus, in accordance with a first aspect, an embodiment of the invention provides a peak detector circuit for producing a voltage that is indicative (preferably a scaled representation) of the maximum voltage of an input signal. The peak detector circuit preferably includes a comparator that receives the input signal and a reference voltage and that has a comparator output that provides a low voltage when the input signal exceeds the reference voltage, and a PNP transistor that is coupled via a resistive network to the comparator output and that is conductive when the comparator output provides a low voltage and is non-conductive when the comparator output provides a high voltage.

When the PNP transistor is conductive, the PNP transistor drives current to charge a capacitor, which produces a DC output voltage. The output capacitor is coupled with a voltage divider circuit that, in turn, provides the reference voltage to the comparator. With this arrangement, the DC output voltage provides an output that is a scaled representation of the maximum voltage of the input signal.

In accordance with another aspect, an embodiment of the invention provides a peak detector circuit that produces a voltage indicative of the maximum voltage of an input signal. The peak detector circuit includes (i) a signal input node and a DC output node, (ii) a comparator having an input connected to the signal input node, a reference input, and a biasing output, (iii) a resistive network connected to said biasing output, the resistive network providing a bias voltage, node, (iv) a PNP transistor having an emitter connected to a supply voltage, a collector connected to the DC output node, and a base connected to the bias voltage node, (v) a DC output capacitor connected to the DC output node for maintaining a DC output level, and (vi) a voltage divider circuit connected between the DC output node and a reference node, the voltage divider having a feedback node connected to the reference input of the comparator.

In this arrangement, the PNP transistor conducts only when the voltage of a signal applied to said signal input exceeds the voltage of said feedback node. When the PNP transistor conducts, it charges the DC output capacitor such that the DC output level is indicative of the maximum voltage of an input signal appearing on the signal input node.

The peak detector may be implemented as part of a network interface unit or other transmission line unit. (such as an office repeater, for instance). In this regard, the peak detector output may be fed to an analog to digital converter whose output is provided in turn to a controller (such as a microprocessor or FPGA). The controller may then use the peak information in the process of setting the level of attenuation and wave shaping in the LBO circuit.

DETAILED DESCRIPTION OF AN EXEMPLARY EMBODIMENT

Figure 3:
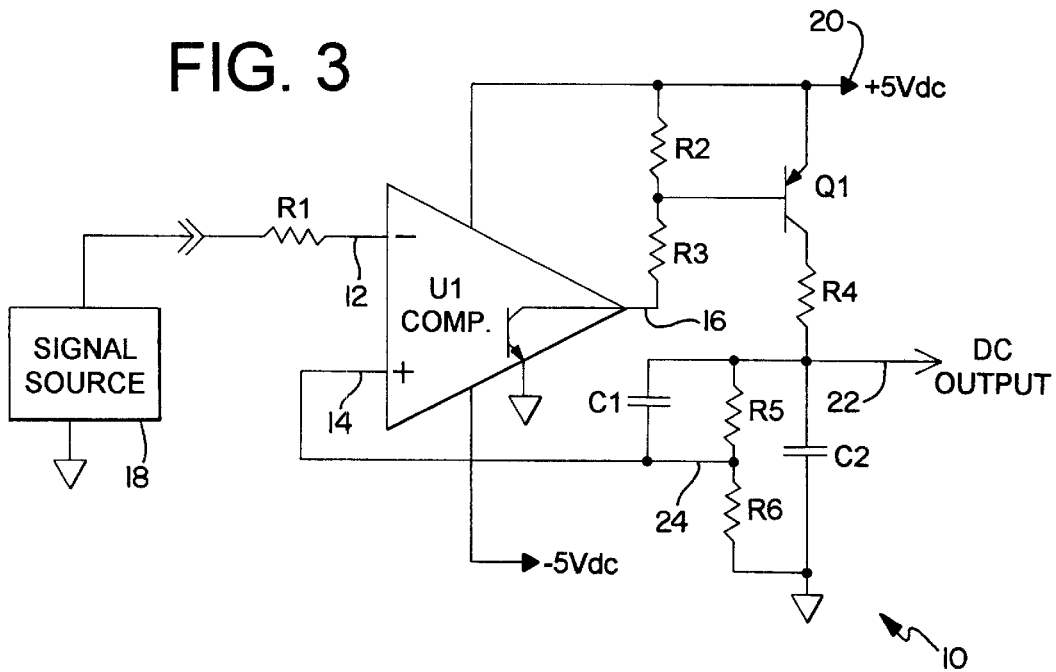

Referring to the drawings, FIG. 3 illustrates a peak detector circuit 10 arranged in accordance with an exemplary embodiment of the present invention. As shown in FIG. 3, circuit 10 includes a comparator U1 having an inverting input 12 and a non-inverting (reference) input 14, and having a U1 output 16. As shown in FIG. 3, comparator U1 output is modelled as an NPN transistor whose base is fed by the voltage difference between the inverting input 12 and the reference input 14, whose emitter is tied to common (e.g., ground), and whose collector provides the U1 output 16. Thus, when the inverting input voltage level is more positive than the reference voltage level, the U1 output 16 approaches common.

A signal source 18 is coupled via a resistor R1 to inverting input 12, and a feedback path is coupled to reference input 14. The U1 output 16 is coupled to one end of a resistor R3. The other end of resistor R3 is coupled to the base of a PNP transistor Q1 and to one end of a resistor R2. The other end of resistor R2, and the emitter of transistor Q1 are in turn coupled to a power supply 20, preferably 5V DC. The collector of transistor Q1 is coupled to one end of a resistor R4, and the other end of resistor R4 provides a DC output 22, which, as described below, will reflect a peak of the signal source.

The DC output 22 is coupled in parallel across a capacitor C2 and a series combination of two resistors R5 and R6, to ground. In turn, a capacitor C1 is coupled in parallel with resistor R5, between the DC output 22 and an end of resistor R6. The node between resistors R5 and R6 (hereafter the "feedback point" 24) then provides the reference input 14 of comparator U1.

In operation, a positive peak of an input signal from the signal source 18 passes through resistor R1 and to the inverting input of comparator U1. With the signal source directly coupled to the comparator, the input signal can be of any shape or bias, as long as the signal is within the operating limits of the comparator.

When the inverting input 12 of comparator U1 goes more positive than the feedback point 24, the output of comparator U1 is driven low (to common). In that state, due to the voltage difference between the power supply 20 and U1 output 16, current flows through resistors R2 and R3, thereby providing a positive voltage to the base of PNP transistor Q1. Since transistor Q1 thus has a more positive emitter voltage than base voltage, transistor Q1 begins to conduct. Current thus flows through transistor Q1 and resistor R4, thereby charging capacitor C2 to provide an increase in DC output 22.

Capacitor C2 continues to charge through resistor R4 until the inverting input signal 12 of comparator U1 is more negative than the reference voltage 14. Resistors R5 and R6 form a voltage divider of the DC output level with respect to the feedback node 24. The voltage division allows the DC output level 22 to be scaled up relative to the peak of the input signal 12. In particular, by providing the voltage divider of R5 and R6 in the feedback path, the comparator and transistor Q1 continue to conduct, thereby charging the capacitor C2 until the voltage at node 24 of the voltage divider reaches the input voltage.

The sum of resistors R5 and R6, along with capacitor C2, forms the RC time constant that defines the discharge time of capacitor C2. The discharge path of C2 ensures that the peak detector does not merely detect an all-time high signal level, but in fact can slowly discharge to accommodate peak detection of slowly varying signal amplitudes.

Capacitor C1 is added to provide negative feedback for high frequency stability. Resistor R4 is used to help equalize the Hfe differences between transistors selected as transistor Q1 and, in particular, to act as a current limiting element to avoid overcharging capacitor C2 in the event the Hfe of transistor Q1 is particularly high. Resistor R1 is added as a current limiting element for voltage surges on the input.

When the inverting input 12 of comparator U1 becomes more negative than the feedback point 24, the comparator stops conducting and therefore provides a floating output, so current does not flow through resistors R2 and R3 from node 20 to node 16. As a result, the base voltage of transistor Q1 begins to approach the emitter voltage of transistor Q1. In turn, this causes transistor Q1 to stop conducting, thereby allowing capacitor to begin discharging from the DC output 22 toward common.

The values and types of the components in circuit 10 can vary depending on the type and frequency of the signal whose peak is to be detected. In an exemplary embodiment, arranged to detect peaks in a T1 signal having a frequency range of 51 kHz to 772 kHz fundamental and up to 6 Vpp near square wave to 200 mVpp sin wave depending on the cable attenuation, the following component values have proven to be robust:

| Component | Value | Description, if applicable |
|-----------|-------|----------------------------|
| R1 | 1.00 kΩ | |
| R2 | 4.32 kΩ | |
| R3 | 10.0 kΩ | |
| R4 | 20 Ω | |
| R5 | 7.5 kΩ | |
| R6 | 20 kΩ | |
| C1 | 100 pF | |
| C2 | 0.1 μF | |
| Q1 | — | high gain PNP transistor BC858C (Hfe = 420–800), available from Moto or Fairchild |
| U1 | — | relatively fast LM219, with separate output emitter connection, available from SGS Thomson or Philips |

Advantageously, in the circuit shown in FIG. 3, the base drive for transistor Q1 does not depend on the DC output level. Rather, the emitter is connected to +5V, so that the base is conveniently driven when the U1 output 16 is driven low, i.e., when the transistor of comparator U1 conducts. In the exemplary embodiment, both the +5V emitter voltage and the U1 output low are substantially fixed voltage points. Therefore, the base drive on Q1 when turned on is a constant current.

As noted above, peak detectors that used an NPN transistor to charge a DC output capacitor require considerable current and power due to the constant current used to establish a biasing voltage for the charging transistor. In particular, because the charging transistor is off most of the time in such a peak detector (until the input signal exceeds the feedback reference), base current must flow through biasing resistors to the base of the NPN transistor, which unfortunately consumes power. In contrast, a PNP transistor, as employed in the exemplary embodiment of the present invention, is biased to the off state by no base current flow. Consequently, the present arrangement consumes less power.

Further, with a high gain transistor Q1, less gate current is required in order to drive current to capacitor C2. Consequently, resistors R2 and R3 can be the relatively high impedance of 4.32 kΩ and 10.0 kΩ respectively.

Resistors R5 and R6 are, in turn, 7.5 kΩ and 10 kΩ respectively, which provides a suitable discharge time and scale up of a 3 V peak input signal to a 0V–5V range. This range is suitable for input to an analog-to-digital converter, to which the output of the peak detector can be conveniently coupled.

Figure 4:
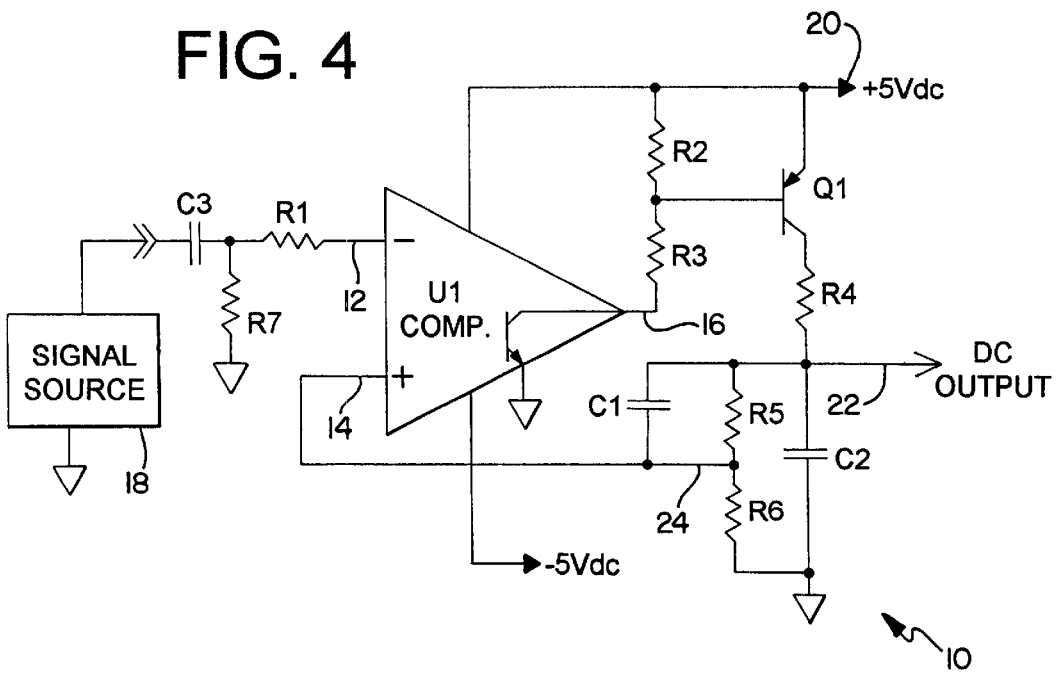

The circuit shown in FIG. 3 works well for input signals biased at common to the peak detector circuit. However, for input signals biased at a level other than common to the peak detector circuit, or where the desire is to first average the input signal to obtain a DC balance and to then detect the peaks of the DC averaged signal, the circuit of FIG. 3 can be modified as shown, for instance, in FIG. 4. Referring to FIG. 4, a series input capacitor C3 and bias resistor R7 have been added. These two elements will AC voltage average the input signal about the common of the comparator circuit. The DC output will consequently be a scaled output equal to the positive peak of the voltage average input.

Figure 5:
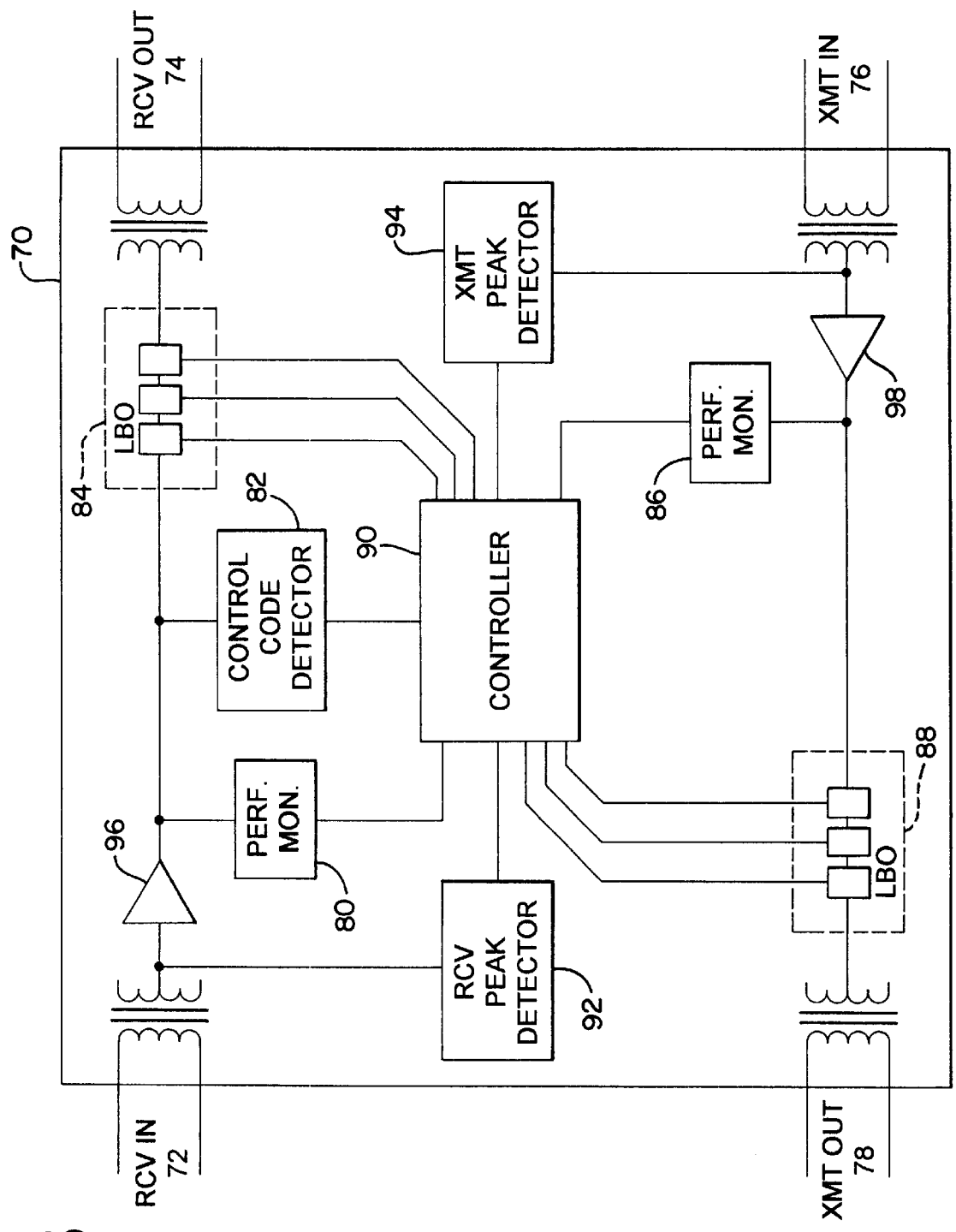
Figure 6:
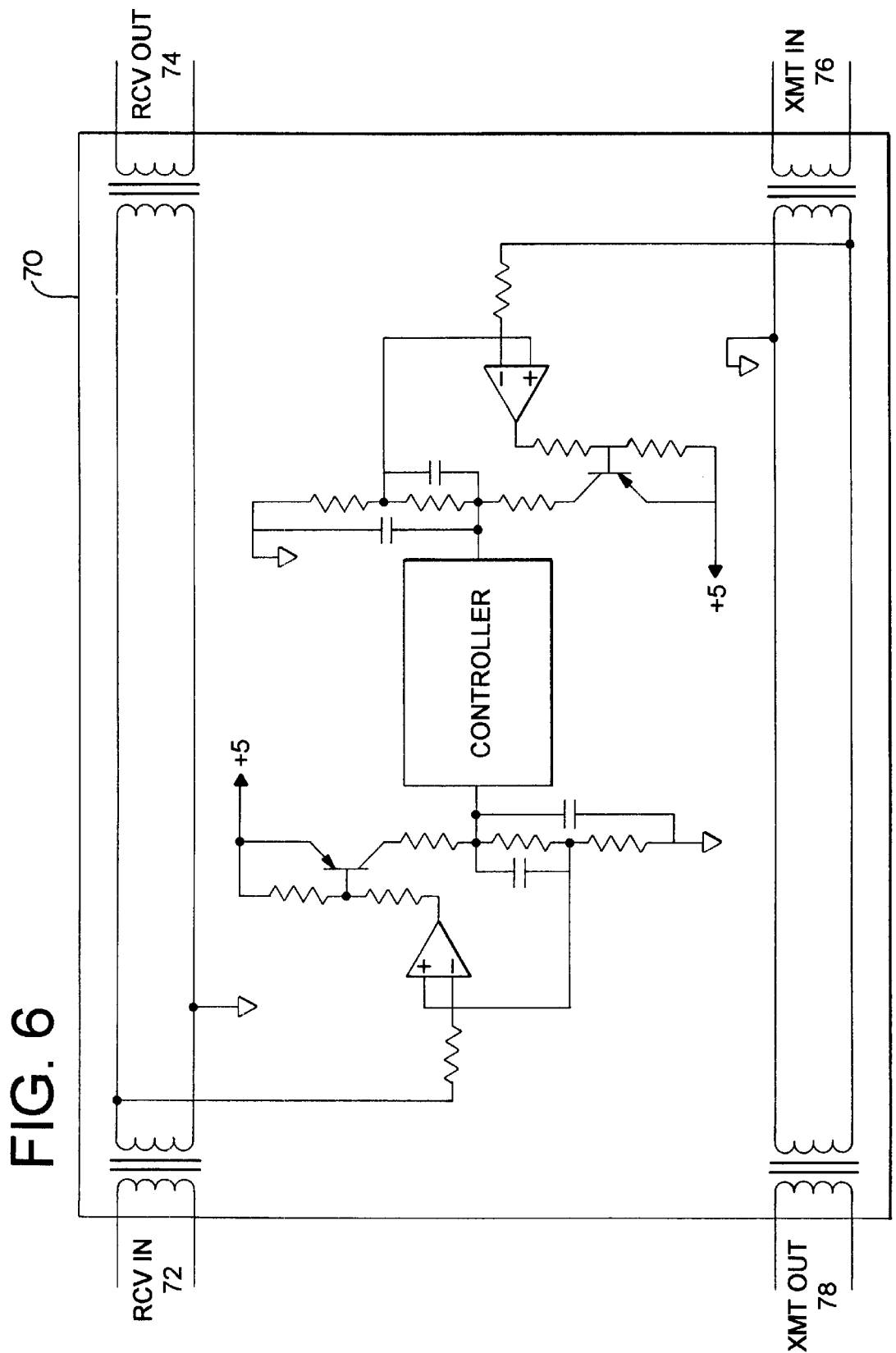

The exemplary embodiment of circuit 10 can be implemented as part of an NIU. FIGS. 5 and 6 illustrate an example of this arrangement. As shown in FIG. 5, an NIU 70 is conventionally coupled to RCV IN line 72, RCV OUT line 74, XMT IN line 76 and XMT OUT line 78. Along the receive path, NIU 70 includes a regenerator 96, a performance monitor 80, a control code detector 82, and an LBO 84. Additionally, along the transmit path, NIU 70 includes a regenerator 98 a performance monitor 86 and an LBO 88. Performance monitors 80, 86 and control code detector 82 are coupled in turn to a controller 90, which may take any suitable form, such as a mechanical switch, a flip-flop or logic gate, a microprocessor, FPGA or dedicated DSP for instance.

As further shown in FIG. 5, two peak detector circuits 92, 94 are provided, one for the receive path and one for the transmit path. In the exemplary embodiment, each of these peak detector circuits takes the same form as that described above and depicted in FIG. 1, as shown in greater detail in FIG. 6. Therefore, the circuit will not be further described here.

The DC output provided by each peak detector circuit is preferably provided to an analog-to-digital converter (not shown) associated with the controller 90. Thus, controller 90 receives a DC representation of the signal peaks along both the receive and transmit paths. The controller 90 may then use this information to set both the receive LBO 84, and transmit LBO 88, for the appropriate T1 signal level.

An exemplary embodiment of the present invention has been illustrated and described. It will be understood, however, that changes and modifications may be made to the invention as described without deviating from the spirit and scope of the invention, as defined by the following claims

I claim:

1. A peak detector circuit for providing a voltage indicative of the maximum voltage of an input signal, the peak detector circuit comprising, in combination:

a comparator receiving the input signal and a reference voltage, and having a comparator output that provides a low voltage when the input signal exceeds the reference voltage;

a PNP transistor coupled via a resistive network to the comparator output, the PNP transistor being conductive when the comparator output provides a low voltage and being non-conductive when the comparator output provides a high voltage;

when the PNP transistor is conductive, the PNP transistor driving current to charge a capacitor, wherein the capacitor provides a DC output voltage; and the capacitor being coupled with a voltage divider circuit that provides the reference voltage to the comparator, whereby the DC output voltage is indicative the maximum voltage of the input signal.

2. A peak detector circuit for providing a voltage indicative of the maximum voltage of an input signal, the peak detector circuit comprising, in combination:

a signal input node and a DC output node;

a comparator having an input connected to said signal input node, a reference input, and a biasing output;

a resistive network connected to said biasing output, said resistive network providing a bias voltage node;

a PNP transistor having an emitter connected to a supply voltage, a collector connected to said DC output node, and a base connected to said bias voltage node;

a DC output capacitor connected to said DC output node for maintaining a DC output level;

a voltage divider circuit connected between said DC output node and a reference node, said voltage divider having a feedback node connected to said reference input of said comparator, wherein said PNP transistor conducts only when the voltage of a signal applied to said signal input exceeds the voltage of said feedback node, thereby charging said DC output capacitor such that the DC output level is indicative of the maximum voltage of an input signal appearing on said signal input node.

3. In a network interface unit having a conducting path for receiving signals from a digital transmission line, a peak detector circuit for providing a voltage indicative of the maximum voltage of a signal carried along the conducting path, the peak detector circuit comprising, in combination:

a signal input node and a DC output node, the signal input node arranged to receive an input signal indicative of the signal carried along the conducting path;

a comparator having an input connected to said signal input node, a reference input, and a biasing output;

a resistive network connected to said biasing output, said resistive network providing a bias voltage node;

a PNP transistor having an emitter connected to a supply voltage, a collector connected to said DC output node, and a base connected to said bias voltage node;

a DC output capacitor connected to said DC output node for maintaining a DC output level;

a voltage divider circuit connected between said DC output node and a reference node, said voltage divider having a feedback node connected to said reference input of said comparator, wherein said PNP transistor conducts only when the voltage of a signal applied to said signal input exceeds the voltage of said feedback node, thereby charging said DC output capacitor such that the DC output level is indicative of the maximum voltage of an input signal appearing on said signal input node.

* * * * *